United States Patent
Iwahori

(10) Patent No.: US 10,529,533 B2
(45) Date of Patent: Jan. 7, 2020

(54) SAMPLE HOLDER, MEMBER MOUNTING DEVICE, AND CHARGED PARTICLE BEAM APPARATUS

(71) Applicant: HITACHI HIGH-TECH SCIENCE CORPORATION, Minato-ku, Tokyo (JP)

(72) Inventor: Toshiyuki Iwahori, Tokyo (JP)

(73) Assignee: HITACHI HIGH-TECH SCIENCE Corporation (JP)

( * ) Notice: Subject to any disclaimer, the term of this patent is extended or adjusted under 35 U.S.C. 154(b) by 0 days.

(21) Appl. No.: 15/936,155

(22) Filed: Mar. 26, 2018

(65) Prior Publication Data
US 2018/0277336 A1  Sep. 27, 2018

(30) Foreign Application Priority Data
Mar. 27, 2017 (JP) .................. 2017-060906

(51) Int. Cl.
*H01J 37/20* (2006.01)
*H01J 37/26* (2006.01)

(52) U.S. Cl.
CPC .............. *H01J 37/20* (2013.01); *H01J 37/26* (2013.01); *H01J 2237/31745* (2013.01)

(58) Field of Classification Search
CPC ... H01J 37/20; H01J 37/26; H01J 2237/31745
See application file for complete search history.

(56) References Cited

U.S. PATENT DOCUMENTS

| | | | |
|---|---|---|---|
| 2004/0178372 A1* | 9/2004 | Rasmussen | G01N 1/04 250/559.22 |
| 2012/0132828 A1* | 5/2012 | Gachter | H01J 37/20 250/440.11 |
| 2016/0189929 A1* | 6/2016 | Hammer | G01N 1/32 250/492.21 |

FOREIGN PATENT DOCUMENTS

JP    6103947    4/1994

* cited by examiner

*Primary Examiner* — Eliza W Osenbaugh-Stewart
(74) *Attorney, Agent, or Firm* — Adams & Wilks

(57) ABSTRACT

A sample holder, a member mounting device, and a charged particle beam apparatus are able to secure a compatible configuration for the transfer of a sample between different-type charged particle beam apparatuses without an increase in equipment costs. The charged particle beam apparatus includes a holder unit for removably fastening a sample holder for receiving a sample, and a sample stage unit for loading the holder unit in a sample chamber. The sample holder includes a sample holding member for receiving a sample, a support section for supporting the sample holding member, and a clip disposed on the support section at a position where the sample holding member is disposed.

6 Claims, 14 Drawing Sheets

SAMPLE HOLDER, MEMBER MOUNTING DEVICE, AND CHARGED PARTICLE BEAM APPARATUS

CROSS REFERENCE TO RELATED APPLICATION(S)

This application claims the benefit of Japanese Patent Application No. 2017-060906, filed on Mar. 27, 2017, which is hereby incorporated by reference in its entirety into this application.

BACKGROUND OF THE INVENTION

1. Technical Field

The present invention relates generally to a sample holder, a member mounting device, and a charged particle beam apparatus.

2. Description of the Related Art

As well known to those skilled in the art, a small sample is often transferred between different-type charged particle beam apparatuses, such as, for example, between a focused ion beam apparatus for processing of a small sample and a transmission electron microscope (TEM) for precise observation of the processed sample. At this time, in the case where an operator manually transfers the small sample using tweezers, for example, the sample may be damaged due to an operator's inadvertent mistake or the like. To solve this problem, a focused ion beam apparatus was proposed which has a compatible sample stage unit to which a sample holder commonly used in different-type charged particle beam apparatuses can be attached (Patent Document 1).

Document of Related Art (Patent Document 1) Japanese Patent Application Publication No. 1994-103947

However, such a conventional focused ion beam apparatus has a problem in that a special compatible sample stage is required for different-type charged particle beam apparatuses to share a sample holder, thereby increasing equipment costs.

SUMMARY OF THE INVENTION

Accordingly, the present invention has been made keeping in mind the above problems occurring in the related art, and an object of the present invention is to provide a sample holder, a member mounting device, and a charged particle beam apparatus, which can secure a compatible configuration for the transfer of a sample between different-type charged particle beam apparatuses while preventing an increase in equipment costs, individually or overall.

(1) In an aspect of the present invention, a sample holder removably fastened to a holder unit of a charged particle beam apparatus, the sample holder including: a sample holding member holding a sample to be irradiated with a charged particle beam; a support section supporting the sample holding member; and a clip to be mounted on a support region of the support section where the sample holding member is disposed.

(2) In an aspect of the present invention, in the sample holder according to item (1), the support section may have a penetration region where through hole or a recessed groove is formed in a thickness direction at a location other than the support region, wherein the clip may have a pair of first and second grip portions forming a pair between which the support section is fitted in between both sides of the thickness direction, wherein the first grip portion presses the sample holding member against the support region on a first surface-side of the support section, as well as blocks at least a portion of the through hole or the groove, and wherein the second grip portion may be provided where the second grip portion does not interfere with the through hole or the groove on a second surface-side of the support section.

(3) In an aspect of the present invention, in the sample holder according to item (2), the support region and the recessed groove may be provided on a first recessed portion formed on the first surface of the support section, and wherein the first grip portion may press the sample holding member against the support region at the first recessed portion, and the second grip portion may be disposed at a second recessed portion formed on the second surface of the support section.

(4) In an aspect of the present invention, in the sample holder according to item (2) or (3), outer shape of both ends of the support section in an orthogonal direction to the thickness direction and a mounting direction of the clip may be formed in a shape changing towards decreasing thickness towards a front end.

(5) In an aspect of the present invention, a member mounting device for mounting the sample holding member to the support section of the sample holder according to any one of items (2) to (4), the member mounting device including: a support section fastening portion fastening the support section with the clip mounted therearound; a displacement member displacing towards the thickness direction of the support section and elastically deforming the clip to broaden a gap between the first grip portion and the second grip portion by being inserted into the hole or the recessed groove towards the first surface side from the second surface side of the support section and pressing the first grip portion in the thickness direction, and a driver mechanism displacing the displacement member in the thickness direction.

(6) In an aspect of the present invention, a charged particle beam apparatus includes: a holder unit removably fastening the sample holder according to any one of items (1) to (4); a sample chamber receiving the holder unit; and a charged particle beam column irradiating a sample with a charged particle beam.

(7) In an aspect of the present invention, in the charged particle beam apparatus according to item (6), the holder unit includes: a support member supporting the sample holder; and a fastening member fastening both ends of the support section to the support member in a direction orthogonal to the thickness direction and a mounting direction of clip.

According to the sample holder, the member mounting device, and the charged particle beam apparatus, with the configuration in which the clip is provided to fasten the sample receptacle member to the support plate section, the sample receptacle member can be easily detachably attached while preventing the damage of a sample. Further, since the sample holder can be held by the holder of different-type charged particle beam apparatuses, an increase in equipment costs can be prevented while securing the compatible configuration for the transfer of a sample between the different-type charged particle beam apparatuses.

BRIEF DESCRIPTION OF THE DRAWINGS

The above and other objects, features and advantages of the present invention will be more clearly understood from the following detailed description taken in conjunction with the accompanying drawings, in which.

DESCRIPTION OF THE PREFERRED EMBODIMENTS

The present invention will be described in detail below with reference to the accompanying drawings.

Figure 1:
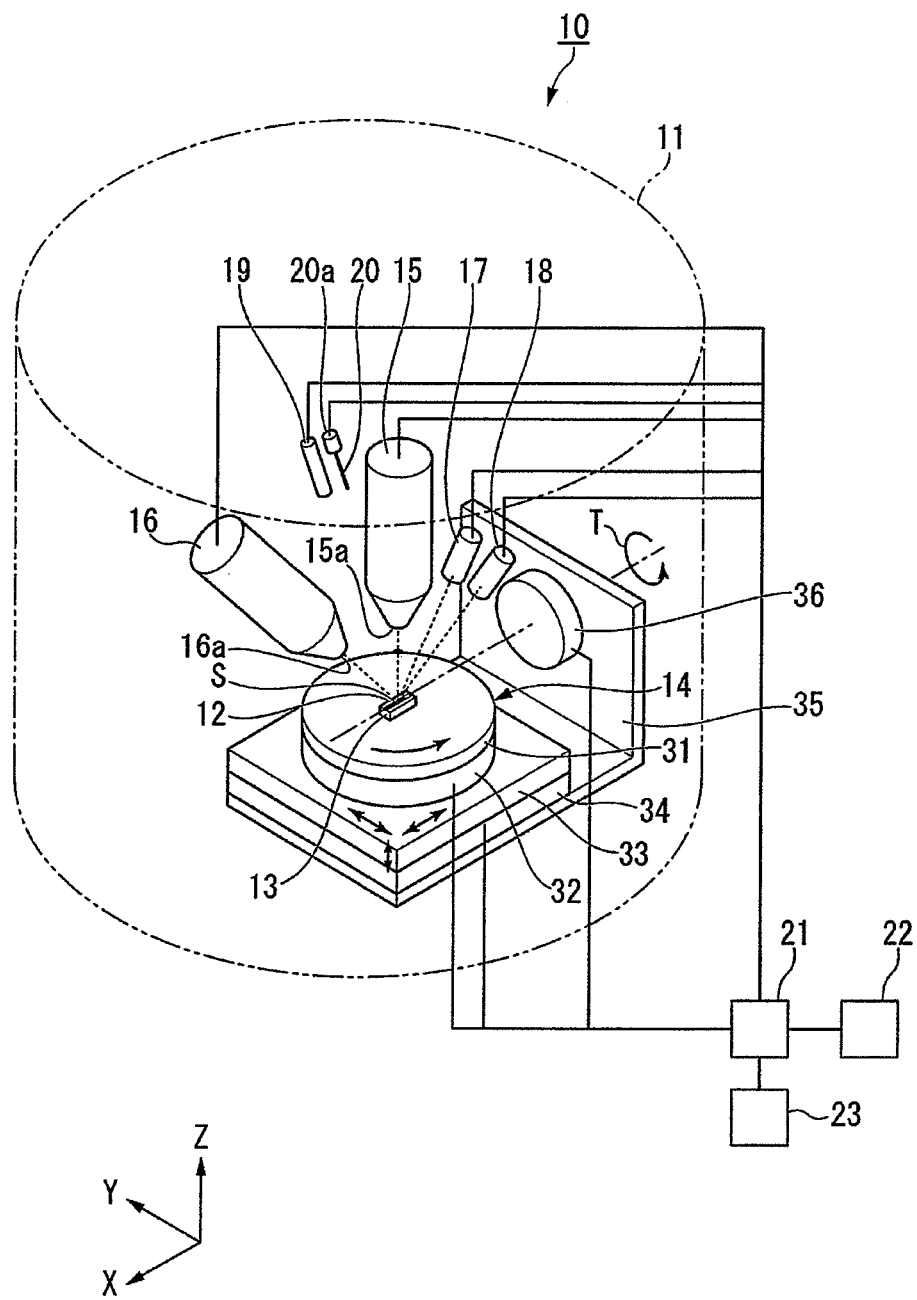
FIG. 1 is a perspective view of a schematic configuration of a charged particle beam apparatus according to embodiments of the present invention.

FIG. 1 is a perspective view illustrating a schematic configuration of a charged particle beam apparatus 10 according to embodiments of the present invention.

The charged particle beam apparatus 10 includes a sample chamber 11 which can maintain the internal pressure in a reduced state, a holder unit 13 which detachably holds a sample holder 12 for receiving a sample S, and a sample stage unit 14 which loads the holder unit 13 thereon in the sample chamber 11. The charged particle beam apparatus 10 also includes an electron beam column 15 and a focused ion beam column 16, which are fastened to the sample chamber 11. Further, the charged particle beam apparatus 10 includes a detector, such as a secondary charged particle detector 17 and an EDS detector 18, which is fastened to the sample chamber 11. Further, the charged particle beam apparatus 10 includes a gas supply 19 supplying a gas to a surface of a sample S, and a needle 20 holding and moving a sample S. Further, the charged particle beam apparatus 10 includes a control unit 21 for the integrated control of the operation of the charged particle beam apparatus 10, and an input unit 22 and a display unit 23, which are connected to the control unit 21 outside the chamber 11.

The sample S may be e.g. a small sample piece obtained from a sample source material. An irradiation target of the electron beam column 15 and the focused ion beam column 16 is not limited to the sample S, but may be the sample source material, the needle 20 existing in the irradiation range, or the like.

As used herein, X-axis, Y-axis, and Z-axis are axes of the 3D orthogonal coordinate system, wherein the X-axis and the Y-axis are parallel with a reference plane (e.g. a horizontal plane) orthogonal to a vertical direction of the charged particle beam apparatus 10, and the Z-axis is parallel with the vertical direction (e.g. orthogonal to the horizontal plane).

The sample chamber 11 has a pressure-resistant hermetic housing which can maintain a desired decompressed state. The sample chamber 11 can be exhausted up to the desired decompressed state by an exhauster (not shown).

The sample holder 12 and the holder unit 13 will be described later.

The sample stage unit 14 includes a sample state section 31 where the holder unit 13 is fastened, a first rotary mechanism 32 for rotating the sample stage section 31 about a rotary axis parallel with the Z-axis, and a first support section 33 supporting the sample stage section 31 and the first rotary mechanism 32. The sample stage unit 14 also includes a stage moving mechanism 34 for moving the first support section 33 parallel with the X-axis, the Y-axis, and the Z-axis, respectively, and a second support section 35 for supporting the first support section 33 and the stage moving mechanism 34. The sample stage unit 14 also includes a second rotary mechanism 36 for rotating the second support section 35 about a tilt shaft T parallel with the X-axis. The second rotary mechanism 36 is fastened to the sample chamber 11. The second rotary mechanism 36 tilts the sample stage section 31 at an angle relative to the Y-axis. The first rotary mechanism 32, the stage moving mechanism 34, and the second rotary mechanism 36 are respectively controlled in response to control signals from the control unit 21 according to operation modes or the like of the charged particle beam apparatus 10.

The electron beam column 15 irradiates an irradiation target in a specified irradiation range inside the sample chamber 11 with an electron beam (EB). The electron beam column 15 is fastened to the sample chamber 11 in a position, for example, in which a beam-emitting end thereof 15a faces the sample stage section 31 in the Z-axis direction, and an optical axis of an electron beam is parallel with the Z-axis direction. The electron beam column 15 includes an electron source which emits electrons, and an electron optical system which focuses and deflects electrons emitted from the electron source. The electron optical system has an electron lens, a deflector, and the like, for example. The electron source and the electron optical system are controlled in response to control signals from the control unit 21 according to irradiation spots, irradiation conditions, or the like of the electron beam.

The focused ion beam column 16 irradiates an irradiation target in a specified irradiation range inside the sample chamber 11 with a focused ion beam (FIB). The FIB column 16 is fastened to the sample chamber 11 in a position, for example, in which a beam-emitting end thereof 16a faces the sample stage section 31 at an inclined angle to the Z-axis direction, and an optical axis of a focused ion beam is parallel with the inclined direction. The FIB column 16 includes an ion source which generates ions, and an ion optical system which focuses and deflects ions generated by the ion source. The ion optical system has a first electrostatic lens such as a condenser lens or the like, an electrostatic deflector, a second electrostatic lens such as an objective, and the like, for example. The ion source and the ion optical system are controlled in response to control signals from the control unit 21 according to irradiation spots, irradiation conditions, or the like of the focused ion beam. The ion source may be a liquid metal ion source of liquid gallium or the like, a plasma-type ion source, a gas field ion source, or the like, for example.

The charged particle beam apparatus 10 may perform image-forming of an irradiation target, a variety of sputtering processing (excavation, trimming, or the like), the formation of a deposition film, or the like, with the scanning and irradiation of the surface of an irradiation target with a focused ion beam. The charged particle beam apparatus 10 may perform the processing for forming a sample piece (e.g. a lamella, a needle-type sample, and the like) for transmission observation by a transmission electron microscope (TEM), a sample piece for the analysis by an electron beam, a sample piece for the probing by a scanning probe microscope, or the like, from a sample source material. The charged particle beam apparatus 10 may perform the processing of a sample piece held by the sample holder 12 into a thin-film sample piece having a desired thickness suitable for the transmission observation by TEM. The charged particle beam apparatus 10 may perform the observation of the surface of an irradiation target, such as a sample source material, a sample piece, a needle 20, or the like, with the scanning and irradiation of the surface of the irradiation target with a focused ion beam, or an electron beam.

Further, the arrangement of the EB column 15 and the FIB column 16 may change such that the EB column 15 is disposed in an inclined direction, and the FIB column 16 is disposed in the Z-axis direction.

The secondary charged particle detector 17 detects secondary charged particles (secondary electrons or secondary ions) emitted from the irradiation target by the irradiation of a focused ion beam or an electron beam. The EDS detector 18 detects X-rays emitted from the irradiation target by the irradiation of an electron beam. The secondary charged particle detector 17 and the EDS detector 18 is connected to the control unit 21 so that detection signals from the secondary charged particle detector 17 and the EDS detector 18 is transmitted to the control unit 21.

The charged particle beam apparatus 10 may include other detector than the secondary charged particle detector 17 and the EDS detector 18. The other detector may be a back-scattered electron detector, an EBSD detector, or the like, for example. The back-scattered electron detector detects electrons back-scattered from the irradiation target by the irradiation of an electron beam. The EBSD detector detects an electron ray backscatter diffraction pattern generated from the irradiation target by the irradiation of an electron beam. A secondary electron detector as the secondary charged particle detector 17 for detecting secondary electrons, and the back-scattered electron detector may be accommodated in a housing of the electron beam column 15.

The gas supply 19 is fastened to the sample chamber 11. The gas supply 19 has a gas injector (nozzle) which is disposed to face the sample stage section 31. The gas supply 19 supplies the irradiation target with an etching gas, a deposition gas, or the like. The etching gas is used to selectively accelerate the etching of the irradiation target by a focused ion beam according to a material of an irradiation target. The deposition gas is used to form a deposition film on the surface of an irradiation target using a deposit such as metal, dielectric, or the like.

The needle 20 is displaced within the sample chamber 11 by a needle driving mechanism 20a installed separately from the sample stage unit 14. The needle 20 extracts a small sample piece from a sample source material fastened on the sample stage unit 14, holds the small sample piece, and transfers the sample piece to the sample holder unit to be described below, for example.

The gas supply 19 and the needle driving mechanism 20a are controlled in response to control signals from the control unit 21 according to operation modes or the like of the charged particle beam apparatus 10.

The control unit 21 integrally controls the operation of the charged particle beam apparatus 10 in response to signals from the input unit 22 or signals generated by a preset automated operation control process. The input unit 22 is a mouse, a keyboard, or the like, which outputs a signal according to an operator's input.

The control unit 21 displays a screen for various setups, such as for processing, and mode selection in the automatic sequence control on the display unit 23. The control unit 21 displays image data, which are generated based on properties detected by various detectors, such as the secondary charged particle detector 17, the EDS detector 18, and the like, on the display unit 23, along with a manipulation screen of the image data. The control unit 21 converts the detected value of the secondary charged particles detected by the secondary charged particle detector 17 while scanning the irradiation position of en electron beam or a focused ion beam to a brightness signal corresponding to the irradiation position so as to generate image data indicative of a shape of an irradiation target using 2D position distribution of the detected value of the secondary charged particles. The control unit 21 displays a screen for executing an operation such as enlargement, scaling-down, and rotation of respective image data, together with the generated image data on the display unit 23.

The sample holder 12 will now be described with reference to the accompanying drawings.

Figure 2:
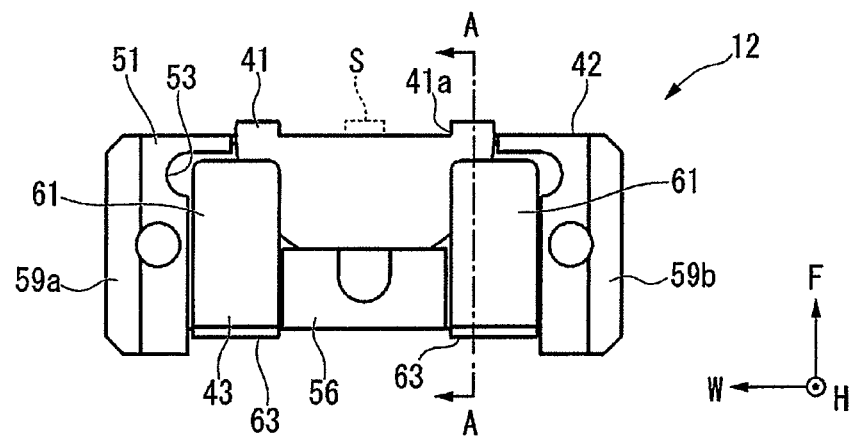
FIG. 2 is a plan view illustrating a sample holder according to embodiments of the present invention, which is viewed from the side of a first surface.
Figure 3:
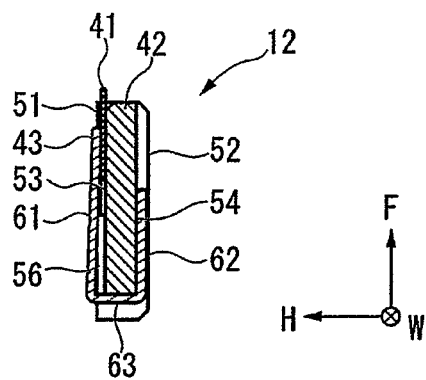
FIG. 3 is a cross-sectional view taken along line A-A of FIG. 2, illustrating the sample holder according to embodiments of the present invention.
Figure 4:
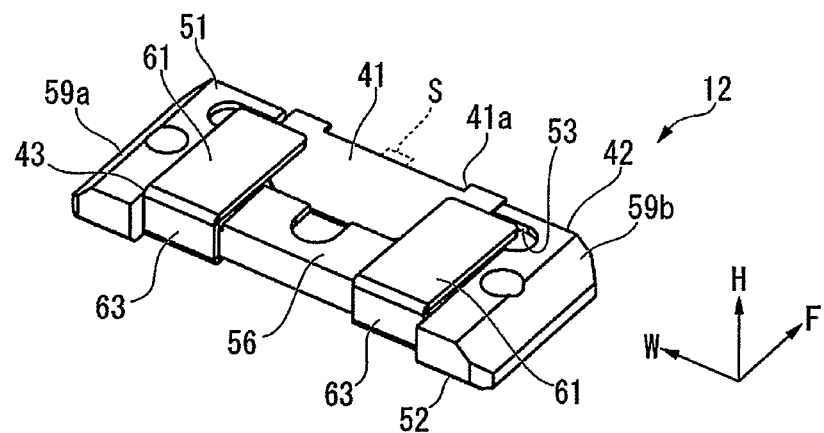
FIG. 4 is a perspective view illustrating the sample holder according to embodiments of the present invention, which is viewed from the first surface side.
Figure 5:
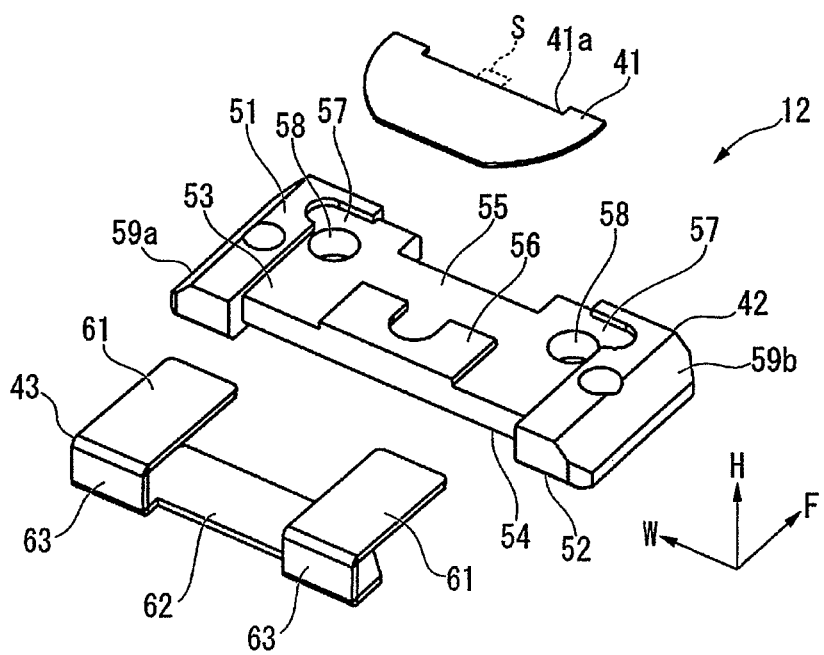
FIG. 5 is an exploded perspective view illustrating the sample holder according to embodiments of the present invention.

FIG. 2 is a plan view illustrating the sample holder 12 according to embodiments of the present invention, which is viewed from the side of a first surface 51. FIG. 3 is a cross-sectional view taken along line A-A of FIG. 2, illustrating the sample holder 12 according to embodiments of the present invention. FIG. 4 is a perspective view illustrating the sample holder 12 according to embodiments of the present invention, which is viewed from the side of the first surface 51. FIG. 5 is an exploded perspective view illustrating the sample holder 12 according to embodiments of the present invention.

The sample holder 12 (stub) is removably fastened to the holder unit 13. The sample holder 12 includes a sample holding member 41 for holding a sample S, a support section 42 for supporting the sample holding member 41, and a clip 43 which is mounted to the support section 42 at a place where the sample holding member 41 is disposed.

The sample holding member 41 (mesh) may be a holder for holding a small sample piece, for example. The sample holding member 41 may have a outer shape like a substantially semi-circular plate, for example. The sample holding member 41 may be formed from metal material, for example. The sample holding member 41 has a cutout portion 41a to which a sample S is connected. The sample S is connected to the cutout portion 41a by a deposition film, which is formed by irradiating the irradiation target with a focused ion beam through the focused ion beam column 16 while supplying a deposition gas using a gas supply.

The support section 42 may have an outer shape like a rectangular plate, for example. The support section has a first surface 51 and a second surface 52, which are opposite in a thickness direction H of the support section 42, wherein the first surface 51 has a first recessed portion 53, and the second surface 52 has a second recessed portion 54. The first recessed portion 53 has a support region 55 where the sample holding member 41 is disposed, and a supporting protrusion 56 for positioning the sample holding member 41 at the support region 55. The first recessed portion 53 has two penetration regions 57 on both sides of the support region 55 in a width direction W orthogonal to the thickness direction H and a mounting direction F of clip 43. The respective penetration region 57 has a through-hole 58 in the thickness direction H.

Outer shape of both ends 59a, 59b of the support section 42 in the width direction W may be formed in a shape changing towards decreasing thickness towards a front end such as a shape of chamfer on the first surface 51 side, for example.

The clip 43 may have a shape in which a rectangular plate is bent, for example. The clip may be formed from an elastic material such as metal or the like, for example. The clip 43 has two first grip portions 61, a second grip portion 62 disposed opposite to the two first grip portions 61, and two connection parts 63 connecting the two first grip portions and the second grip portion 62.

The clip 43 is attached to the first recessed portion 53 and the second recessed portion of the support section 42 such that the support section 42 is fitted in between both sides of the thickness direction H by the first grip portion 61 and the second grip portion 62. Respective first grip portions 61 is fastened at the first recessed portion 53 of the first surface 51 of the support section 42 by pressing the sample holding member 41 against the support region 55 while blocking at least a portion of the through holes 58 of the respective penetration regions 57. The second grip portion 62 is disposed at the second recessed portion 54 of the second surface 52 of the support section 42 where the second grip portion 62 does not interfere with the through holes 58.

The clip 43 is configured to maintain the mounted state to the support section 42 even when the sample holding member 41 is not disposed at the support section 42. The clip 43 maintains the mounted state to the support section 42 by elastic fitting the support section between the first and second grip portions 61 and 62, or otherwise adhesion, soldering, or welding of the second grip portion 62 to the support section 42.

The holder unit 13 will now be described with reference to the accompanying drawings.

Figure 6:
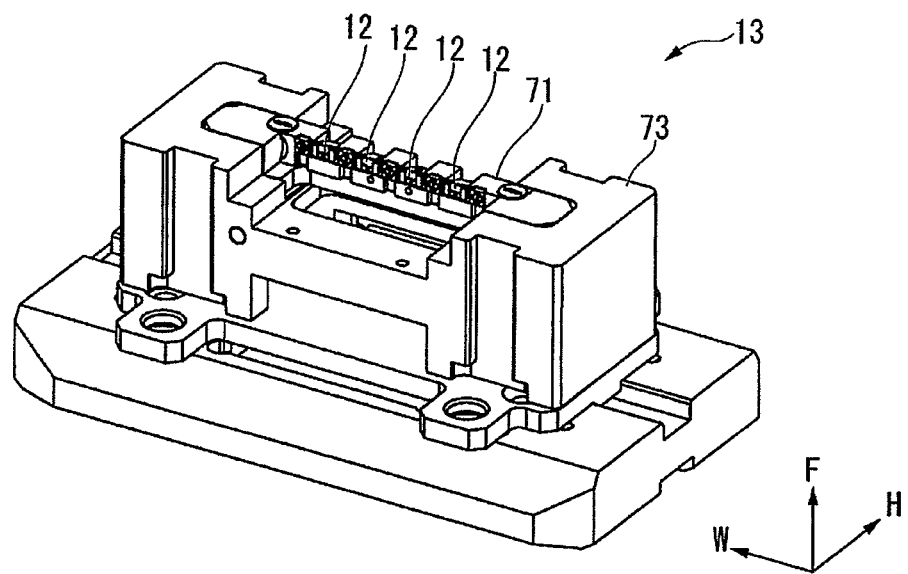
FIG. 6 is a perspective view illustrating a schematic configuration of a holder unit of the charged particle beam apparatus.
Figure 7:
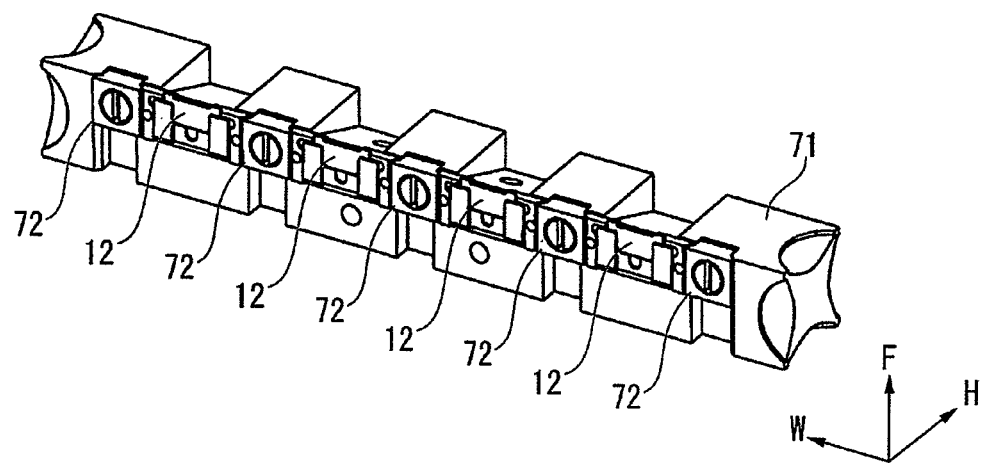
FIG. 7 is an enlarged perspective view illustrating a portion of the holder unit of the charged particle beam apparatus according to embodiments of the present invention.
Figure 8:
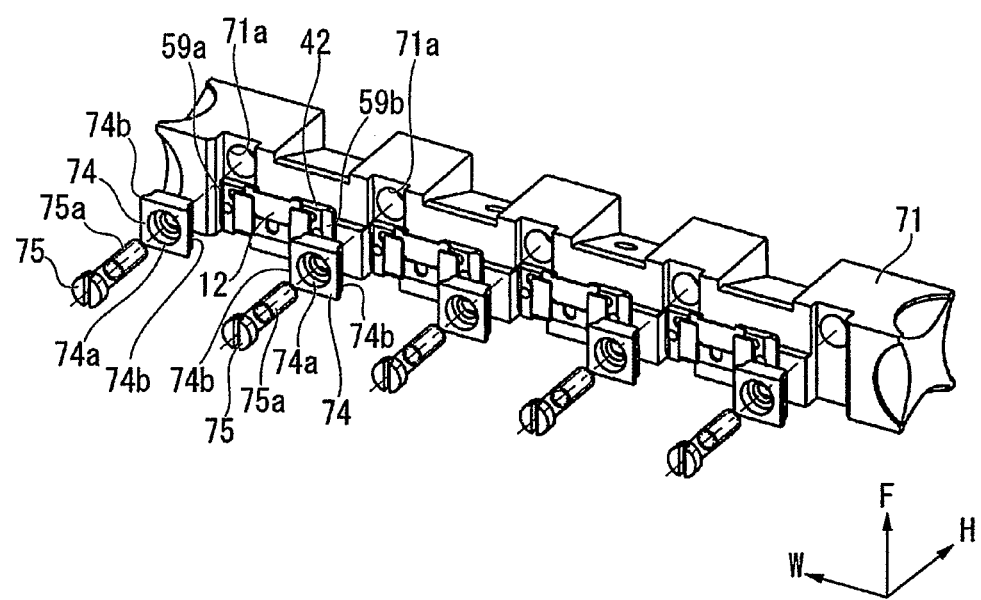
FIG. 8 is a partially exploded perspective view illustrating the holder unit of the charged particle beam apparatus according to embodiments of the present invention.

FIG. 6 is a perspective view illustrating a schematic configuration of the holder unit 13 of the charged particle beam apparatus 10. FIG. 7 is an enlarged perspective view illustrating a portion of the holder unit 13 of the charged particle beam apparatus 10 according to embodiments of the present invention. FIG. 8 is a partially exploded perspective view illustrating the holder unit 13 of the charged particle beam apparatus 10 according to embodiments of the present invention.

The holder unit 13 is a bracket-type holder, for example, which is fastened to the sample stage unit 14. The holder unit 13 removably fastens at least one sample holder 12. The holder unit 13 includes a support member 71 for supporting four sample holders 12, for example, in a width direction W, fastening members 72 for fastening both ends 59a, 59b of the support sections 42 of the respective sample holder a 12 to the support member 71, and a fastening block section 73 for fastening the support member 71.

The fastening member 72 has a fastening part 74 for pressing the respective end 59a, 59b of the support section 42 against the support member 71, and a screw 75 for fastening the fastening part 74 to the support member 71.

The fastening part 74 may have an outer shape like a rectangular plate or the like, for example. The fastening part 74 has a screw hole 74a with a counter-bored portion for receiving a head of the screw 75. The fastening part 74 has a protrusion 74b to be brought into contact with the respective end 59a, 59b of the supporting section 42. The outer shape of the protrusion 74b corresponds to the shape of the both ends 59a, 59b of the support section 42 so that the shape of the protrusion 74b is formed in a shape changing towards decreasing thickness towards a front end. The protrusion 74b is formed such that the surface of the fastening part 74 is substantially level with the first surface 51 of the support section 42 with the fastening part 74 fastened to the support member 71.

The screw 75 is screwed into the screw hole 74a of the fastening part 74 and a mounting hole 71a of the support member 71 so as to press the sample holder 12 against the support member 71 through the fastening part 74, thereby fastening the sample holder 12. The screw 75 is provided with a spring member 75a fitted around a shank thereof. The spring member 75a generates an elastic force resistant to the fastening of the screw 75.

A member mounting device 80 for the attachment of the sample receptacle member 41 to the support section 42 of the sample holder 12 will now be described with reference to the accompanying drawings.

Figure 9:
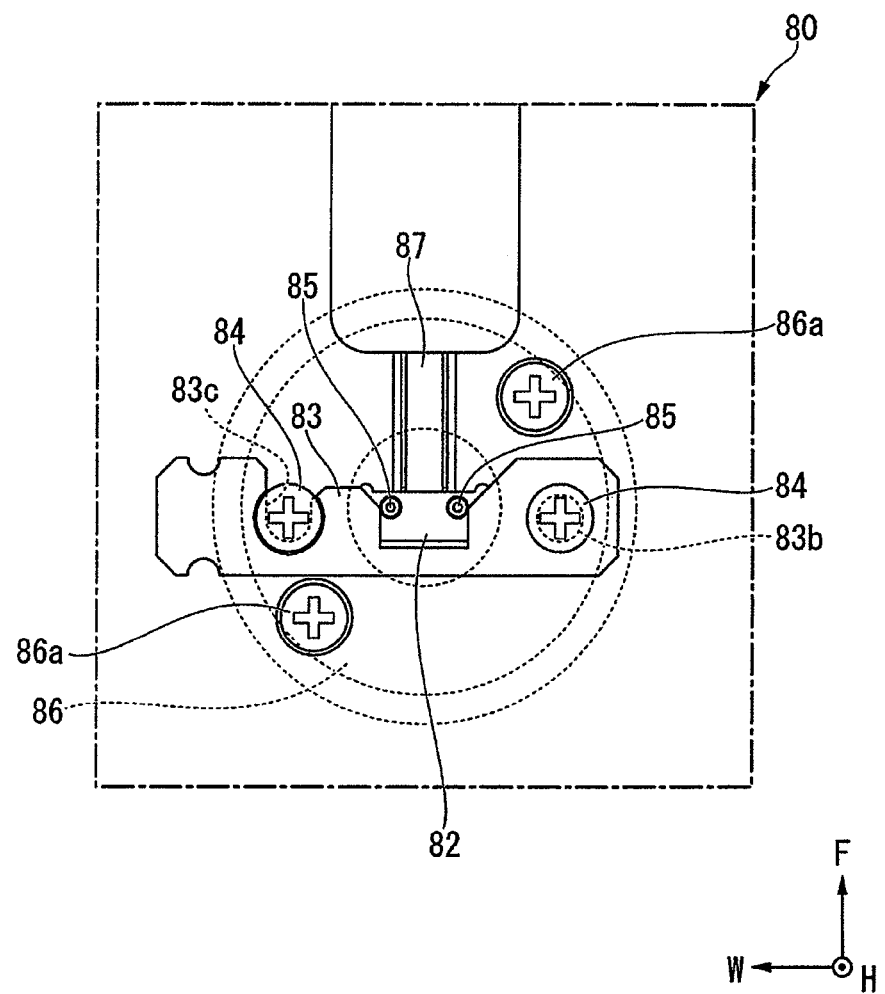
FIG. 9 is a plan view of a member mounting device according to embodiments of the present invention, showing a schematic internal configuration, which is partially transparent.
Figure 10:
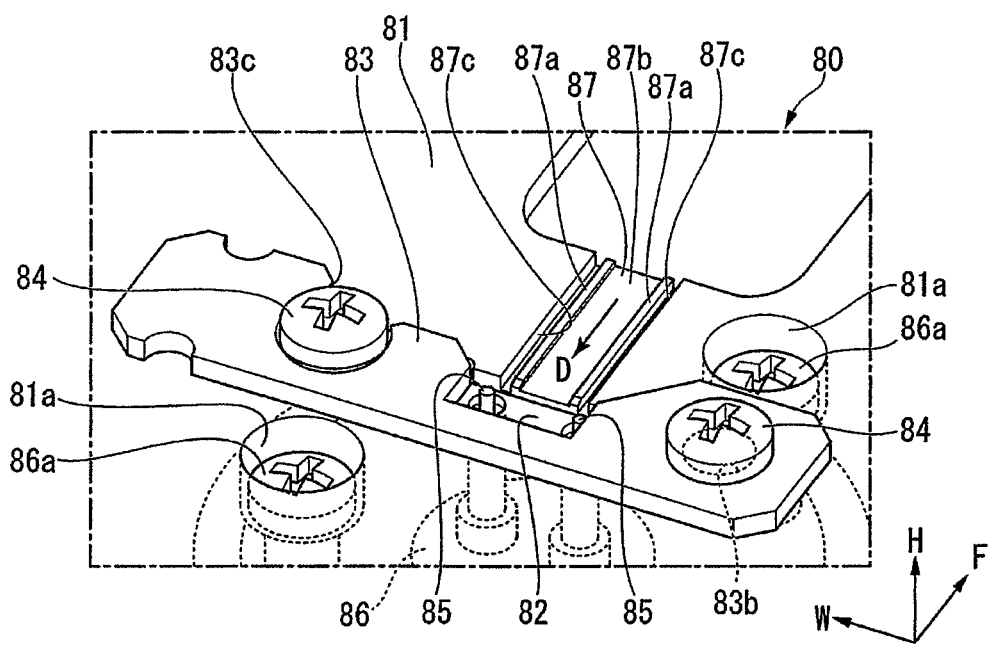
FIG. 10 is a perspective view of the member mounting device according to embodiments of the present invention, showing a schematic internal configuration, which is partially transparent.
Figure 11:
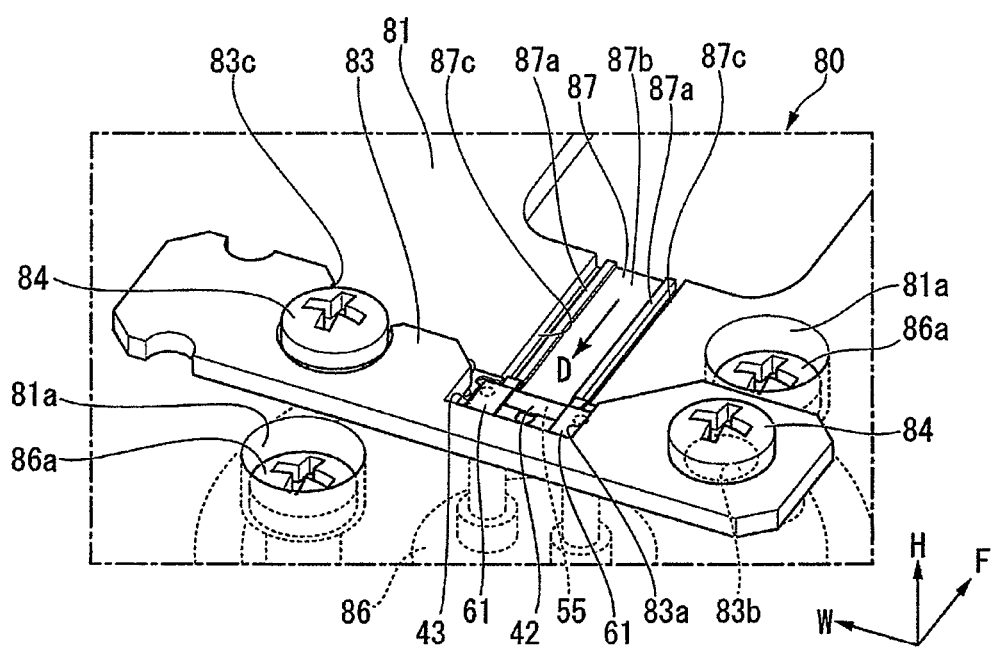
FIG. 11 is a perspective view of the member mounting device according to embodiments of the present invention in which the sample holder is loaded, showing a schematic internal configuration, which is partially transparent.

FIG. 9 is a plan view of the member mounting device 80 according to embodiments of the present invention, showing a schematic internal configuration, which is partially transparent. FIG. 10 is a perspective view of the member mounting device 80 according to embodiments of the present invention, showing a schematic internal configuration, which is partially transparent. FIG. 11 is a perspective view of the member mounting device 80 according to embodiments of the present invention in which the sample holder is loaded, showing a schematic internal configuration, which is partially transparent.

The member mounting device 80 includes a main body section 81, a mounting portion 82 for mounting the support section 42 with the clip attached thereto, a planar member 83 for fastening the support section 42, and a fastening screw 84 for fastening the planar member 83 to the main body section 81. The member mounting device 80 includes two pin members 85 which are displaced in the thickness direction H of the support section 42, a driver mechanism 86 for displacing the two pin members 85, and a guide section 87 for guiding the sample holding member 41 towards the support section 42.

The mounting portion 82 has an outer shape like a recess formed in the surface of the main body section 81, for example, which is capable of receiving the support section 42 with the clip attached thereto while positioning the same to a proper position.

The planar member 83 has contact parts 83a which contact and press the both ends 59a, 59b of the support section 42, which is placed on the mounting portion 82, against the mounting portion 82, thereby fastening the support section 42. The planar member 83 has a screw hole 83b and a groove 83c for the fastening screws 84. The planar member 83 is configured such that when the two fastening screws 84 are screwed into the screw holes of the main body section 81, the contact parts 83a contact the both ends 59a, 59b of the support section 42 and thus press the support section 42 against the mounting portion 82, thereby fastening the support section. When the two fastening screws 84 are loosened, the planar member 83 is rotatable on the surface of the main body section 81 such that the fastening screw 84 moves out of the groove 83c about the fastening screw 84 screwed into the screw hole 83b. When the fastening screw 84 moves out of the groove 83c, the planar member 83 is disposed such that the both ends 59a, 59b of the support section 42 and the contact part 83a do not interfere with each other in the thickness direction H of the support section 42, thereby facilitating the detachment of the support section 42 from the mounting portion 82.

The two pin members 85 are displaced between a first position where they are received into the mounting portion 82 and a second position where they protrude from the surface of the mounting portion 82 in a normal direction to the surface of the mounting portion 82. When protruded from the surface of the mounting portion 82, the pin member 85 is inserted into the through hole 58 towards the first surface 51 from the second surface 52 side of the support section 42 and presses the first grip portions 61 in the thickness direction H so as to elastically deform the clip 43 such that a distance between the first grip portion 61 and the second grip portion 62 is enlarged. When the two first grip portions 61 are separated from the support region 55 of the support section 42 by the two pin members 85, a space for inserting the sample holding member 41 is formed between the two first grip portions 61 and the support region 55. When the pin member 85 is displaced so as to be received in the mounting portion 82 with the sample holding member 41 disposed at the support region 55 of the support section 42, the elastic deformation of the clip 43 by the pin members 85 is relieved, and the first grip portions 61 press the sample holding member 41 against the support region 55, thereby fastening the sample holding member.

The driver mechanism 86 individually displaces the two pin members 85, for example. The driver mechanism 86 has two manipulation screws 86a which are manipulated to individually displace the two pin members 85. The driver mechanism 86 is respectively connected to the two pin members 85 in the main body section 81 so as to respectively transmit a driving force input to the two manipulation screws 86a to the two pin members 85, thereby displacing the two pin members 85. The two manipulation screws 86a are respectively screwed into two screw insertion holes 81a formed in the surface of the main body section 81.

The guide section 87 has an outer shape which allows the sample holding member 41 to be slidably moved towards the support section 42 placed on the mounting portion 82 while positioning the sample holding member 41, such as a support stage or the like installed in a recess of the surface of the main body section 81. The guide section 87 has a slide part 87b with two guide rails 87a where the sample holding member 41 is placed, and two guide walls 87c positioning the sample holding member 41.

The two guide rails 87a extend parallel with a sliding direction D of the sample holding member 41 on the guide section 87 while being spaced apart by a distance that is smaller than the width W of the sample holding member 41. A height of the guide rail 87a above the surface of the slide part 87b in the normal direction is slightly higher than the surface of the support region 55 of the support section 42 placed on the mounting portion 82, for example. Frond ends of the guide rails 87a in the sliding direction D have a downward inclination changing towards lowering height towards the front end as they go forward in order to smoothly transfer the sample holding member 41 to the support section 42, for example.

The two guide walls 87c extend parallel with the sliding direction D while being spaced apart by a distance that is slightly greater than the width W of the sample holding member 41 in order to allow the sample holding member 41 to be fitted therebetween.

As set forth before, according to the sample holder 12 of the present embodiment, since the clip 43 is provided to fasten the sample holding member 41 relative to the support section 42, the sample holding member 41 can be easily mounted while preventing the sample S from being damaged. Further, compared to the case of fastening the sample holding member 41 relative to the support section 42 using screws or the like, the sample holder 12 can be made smaller.

With the configuration in which the clip 43 has the first grip portion 61 which blocks the through hole 58 on the first surface 51 side of the support section 42, and the second grip portion 62 which do not interfere with the through hole 58 on the second surface 52 side of the support section 42, the first grip portion 61 can be pressed by the pin members 85 inserted through the through hole 58. Accordingly, a space for insertion of the sample holding member 41 can be easily formed between the first grip portion 61 and the support section 55, and the sample holding member 41 can thus be easily mounted to the support section 42.

The clip 43 is attached to the first and second recessed portions 53 and 54 formed in the first and second surfaces 51 and 52, respectively, of the support section 42, thereby preventing an increase in the thickness of the sample holder 12.

Since both ends 59a, 59b of the support section 42 have a shape changing towards decreasing thickness towards a front end, when the both ends 59a, 59b is pressed against the support member 71 of the holder unit 13 using the fastening parts 74, an increase in the thickness is prevented.

According to member mounting device 80 of the present embodiment, since the pin members 85 which are inserted into the through hole 58 of the support section 42 and press the first grip portion 61, are provided to enlarge a distance between the first grip portion 61 and the second grip portion 62, a space for insertion of the sample holding member 41 can be easily formed between the support section 42 and the clip 43.

According to the charged particle beam apparatus 10 of the present embodiment, since the holder unit 13 is provided to removably fasten the sample holder 12, an increase in equipment costs can be prevented while securing the compatible configuration for the transfer of a sample S.

Since the holder unit 13 has the fastening members 72 for fastening the both ends 59a, 59b of the support section 42 of the sample holder 12 to the support member 71, compared to the case of having a member contacting other part than the both ends 59a, 59b, an increase in the thickness is prevented.

A first modified embodiment of the former embodiment will be described with reference to the accompanying drawings.

Figure 12:
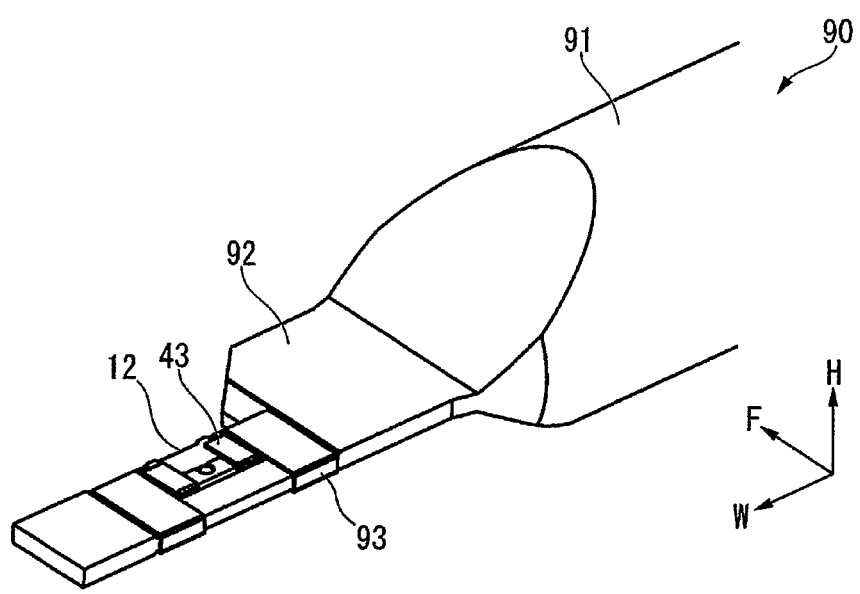
FIG. 12 is a perspective view illustrating a portion of a holder unit of a charged particle beam apparatus according to a first modified embodiment of the present invention.
Figure 13:
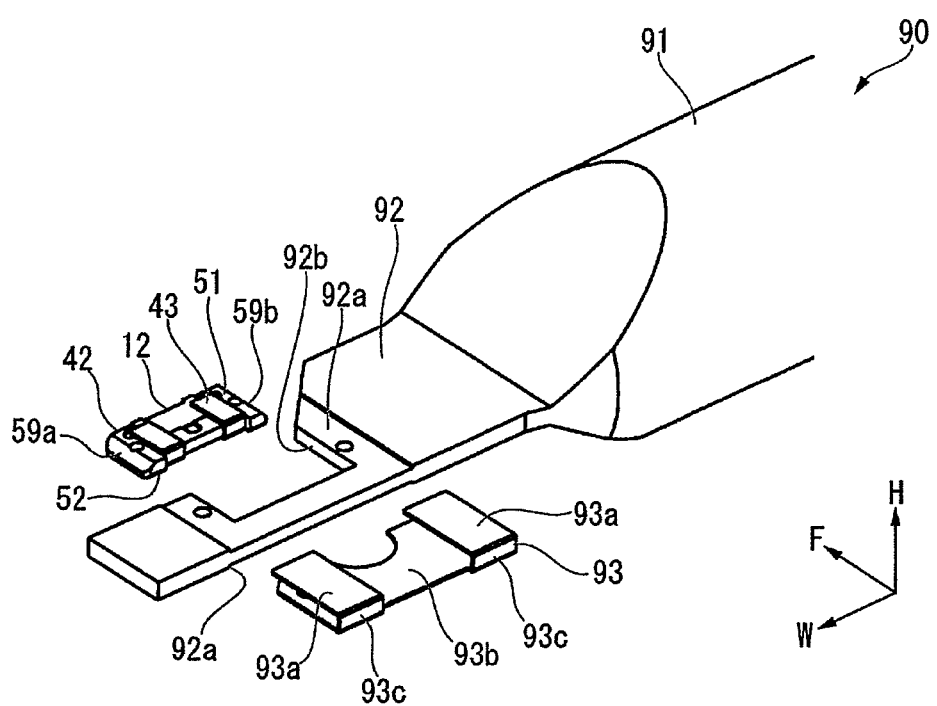
FIG. 13 is an exploded perspective view illustrating a portion of the holder unit of the charged particle beam apparatus according to the first modified embodiment of the present invention.

FIG. 12 is a perspective view illustrating a portion of a holder unit 90 of a charged particle beam apparatus 10 according to the first modified embodiment of the present invention. FIG. 13 is an exploded perspective view illustrating a portion of the holder unit 90 of the charged particle beam apparatus 10 according to the first modified embodiment of the present invention.

While the foregoing embodiment has illustrated the holder unit 13 as a bracket-type holder unit, the present invention is not limited thereto. The holder unit 13 may be other-type holder unit such as rod-type holder unit, for example. Further, the same element as that of the foregoing embodiment will be denoted by the same reference numeral, and a description thereof will be omitted or simplified.

The holder unit 90 of the first modified embodiment is a rod-type holder unit which is used in a side-entry type sample stage unit, for example. The holder unit 90 may be used when an electron beam column 15 constitutes an electron microscope such as SEM and a TEM. The holder unit 90 removably holds a sample holder 12 in order to detect transmission electrons of a sample S by the irradiation of an electron beam.

The holder unit 90 includes a rod-type support section 91, a planar support section connected to a frond end of the rod-type support section 91, and a leaf spring fastener removably fastening the sample holder 12 to the planar support section 92. The planar support section 92 is provided with recessed portions 92a on opposite surfaces thereof in the thickness direction, wherein a cutout part 92b is formed in the recessed portion 92a so as to dispose the sample holder 12 thereinto.

The leaf spring fastener 93 has a shape in which a rectangular plate is bent, for example. The leaf spring fastener 93 includes two first grip plates 93a, a second grip plate 93b disposed oppositely to the two first grip plates 93a, and two connection plates 93c connecting the two first grip plates 93a and the second grip plate 93b.

The leaf spring fastener 93 is attached to the two recessed portions 92a of the planar support section 92 such that the support section 42 and the planar support section 92 are fitted in between both sides of the thickness direction H by the two first grip plates 93a and the second grip plate 93b. The two first grip plates 93a contact the first surface 51 of the support section 42 at a position where they do not interfere with the clip 43. The second grip plate 93b contacts the second surface 52 of the support section 42 at a position where it does not interfere with the clip 43. The second grip plate 93b is fastened to the recessed portion 92a of the planar support section 92 by means of adhesion, soldering, welding, or the like.

According to the first modified embodiment, since the sample holder 12 can be fastened to the holder unit of different-type charged particle beam apparatuses 10, an increase in equipment costs can be prevented while securing the compatible configuration for the transfer of a sample S between the different-type charged particle beam apparatuses.

A second modified embodiment of the foregoing embodiment will now be described with reference to the accompanying drawings.

Figure 14:
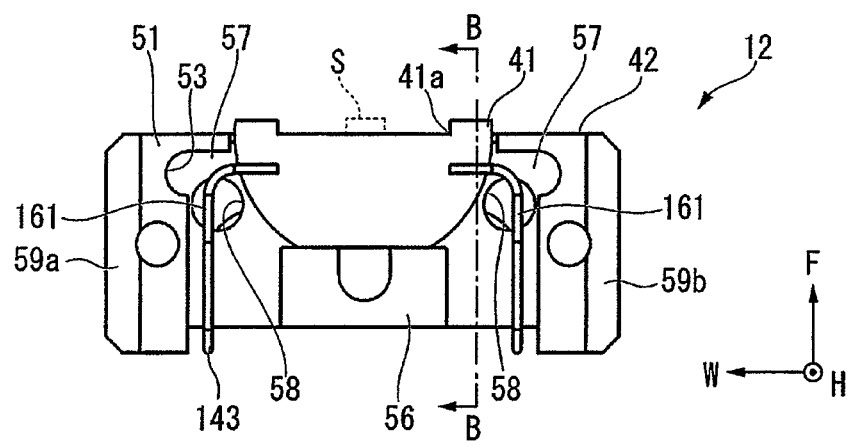
FIG. 14 is a plan view illustrating a sample holder according to a second modified embodiment of the present invention, which is viewed from a first surface side.
Figure 15:
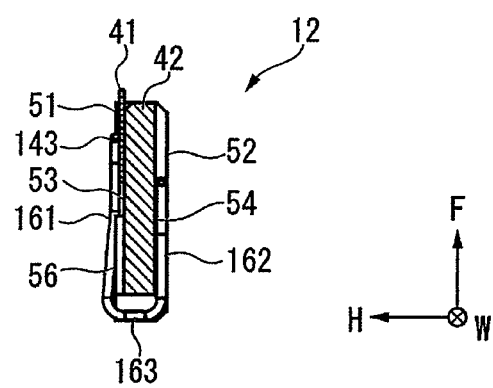
FIG. 15 is a cross-sectional view illustrating the sample holder according to the second modified embodiment of the present invention, which is taken along line B-B of FIG. 14.
Figure 16:
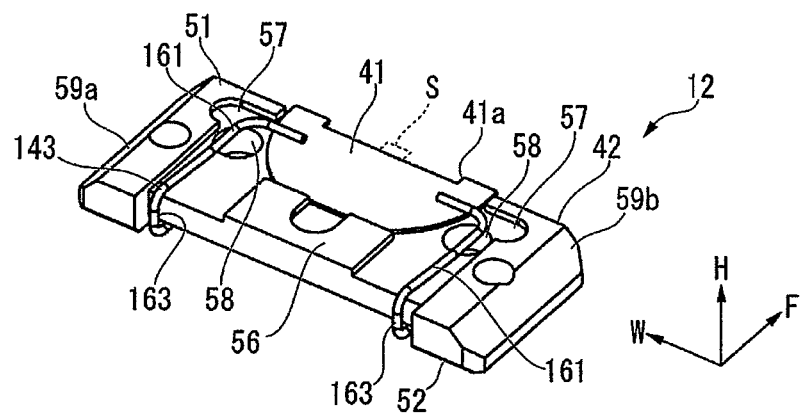
FIG. 16 is a perspective view illustrating the sample holder according to the second modified embodiment of the present invention, which is viewed from the first surface side.
Figure 17:
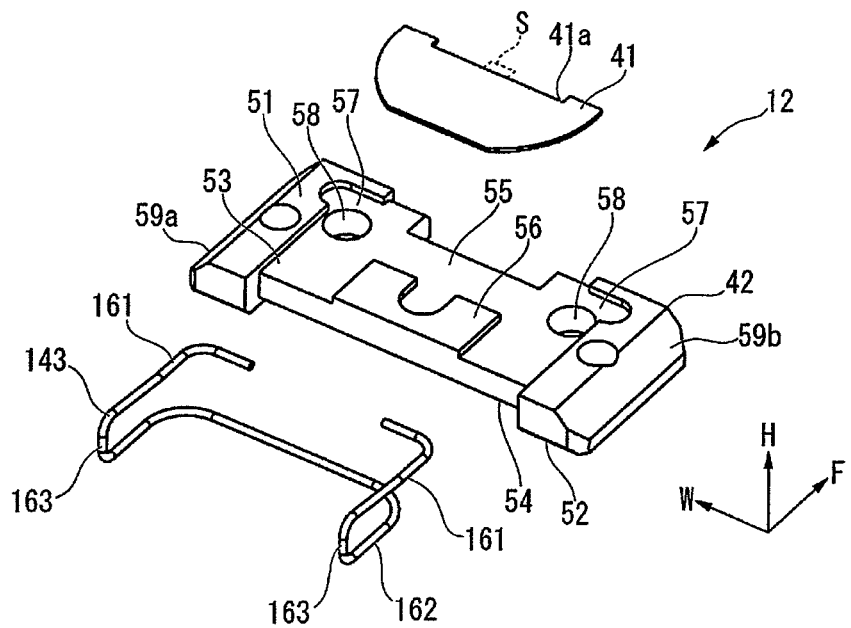
FIG. 17 is an exploded perspective view illustrating the sample holder according to the second modified embodiment of the present invention.

FIG. 14 is a plan view illustrating a sample holder 12 according to the second modified embodiment of the present invention. FIG. 15 is a cross-sectional view illustrating the sample holder 12 according to the second modified embodiment of the present invention, which is taken along line B-B of FIG. 14. FIG. 16 is a perspective view illustrating the sample holder 12 according to the second modified embodiment of the present invention, which is viewed from the side of the first surface 51. FIG. 17 is an exploded perspective view illustrating the sample holder 12 according to the second modified embodiment of the present invention.

While the above embodiment has illustrated the clip 43 as a planar member, the present invention is not limited thereto. The clip 43 may be formed from a member having other shape, such as a linear shape, than the planar shape. Further, the same element as that of the foregoing embodiment will be denoted by the same reference numeral, and a description thereof will be omitted or simplified.

A clip 143 according to the second modified embodiment has an outer shape in which a linear member is bent, for example. The clip 143 includes two first grip portions 161, a second grip portion 162 disposed oppositely to the two first grip portions 161, and two connection parts 163 connecting the two first grip portions 161 and the second grip portion 162.

The clip 143 is attached to the first recessed portion 53 and the second recessed portion 54 of the support section 42 such that the support section 42 is fitted in between both sides of the thickness direction H by the two first grip portion 161 and the second grip portion 162. The respective first grip portions 161 press and fastens the sample holding member 41 against the support region 55 at the first recessed portion 53 on the first surface 51 side of the support section 42 while blocking at least a portion of the through holes 58 of the penetration regions 57. The second grip portion 162 is disposed at the second recessed portion 54 on the second surface 52 side of the support section 42 at a position where it does not interfere with the through hole 58.

The clip 143 is configured to maintain the mounted state to the support section 42 even when the sample holding member 41 is not disposed at the support section 42. The clip 143 maintains the mounted state to the support section 42 by elastically fitting the support section 42 between the first and second grip portions 161 and 162, or otherwise fastening the second grip portion 162 to the support section 42 by means of adhesion, soldering, welding, or the like.

According to the second modified embodiment, since the clip 143 is formed from a linear member, the sample holder 12 can be made lighter, and the sample holder 12 can be easily mounted onto the support section 42 as well.

A third modified embodiment of the foregoing embodiment will now be described with reference to the accompanying drawings.

Figure 18:
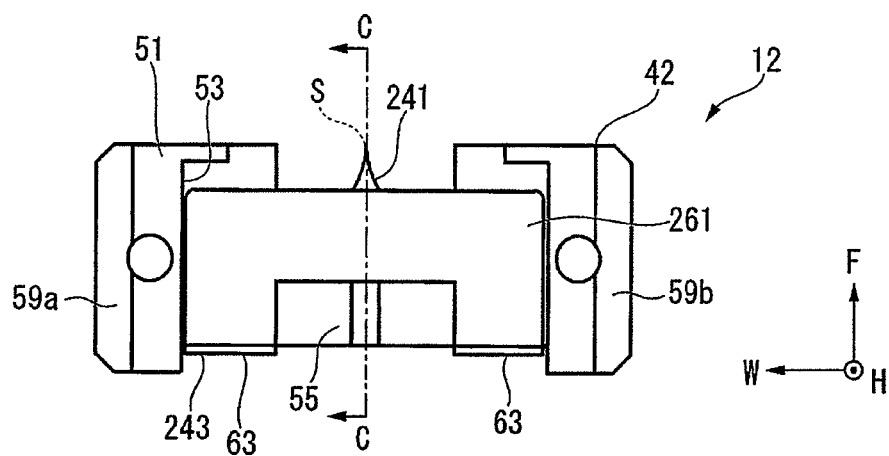
FIG. 18 is a plan view illustrating a sample holder according to a third modified embodiment of the present invention, which is viewed from the side of a first surface.
Figure 19:
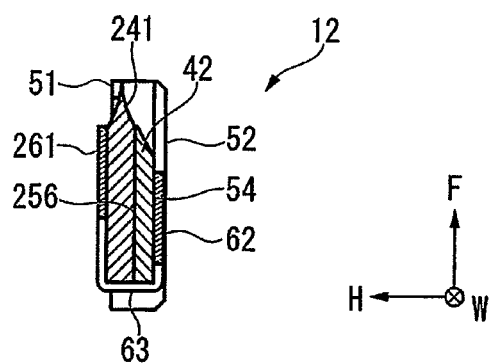
FIG. 19 is a cross-sectional view illustrating the sample holder according to the third modified embodiment of the present invention, which is taken along line C-C of FIG. 18.
Figure 20:
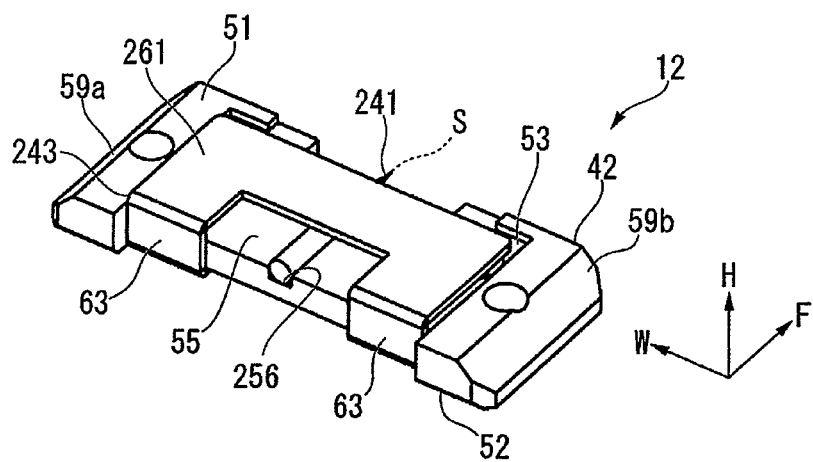
FIG. 20 is a perspective view illustrating the sample holder according to the third modified embodiment of the present invention, which is viewed from the first surface side.
Figure 21:
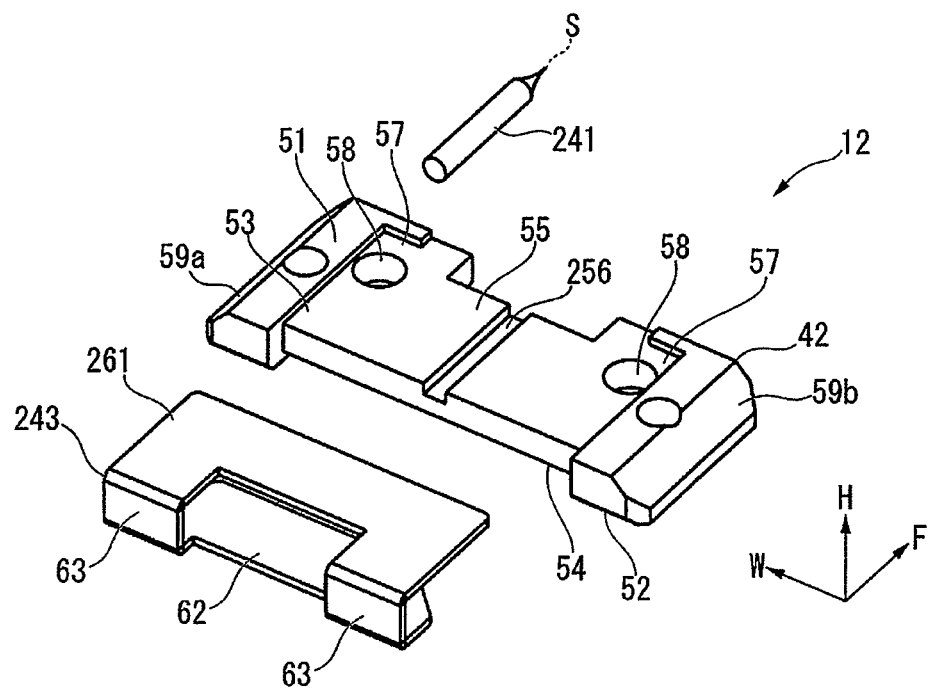
FIG. 21 is an exploded perspective view illustrating the sample holder according to the third modified embodiment of the present invention.

FIG. 18 is a plan view illustrating a sample holder 12 according to the third modified embodiment of the present invention, which is viewed from the side of a first surface 51. FIG. 19 is a cross-sectional view illustrating the sample holder 12 according to the third modified embodiment of the present invention, which is taken along line C-C of FIG. 18. FIG. 20 is a perspective view illustrating the sample holder 12 according to the third modified embodiment of the present invention, which is viewed from the side of the first surface 51. FIG. 21 is an exploded perspective view illustrating the sample holder 12 according to the third modified embodiment of the present invention.

While the foregoing embodiment has illustrated the sample holding member 41 as a planar member, the present invention is not limited thereto. The sample holding member 41 may be formed from a member, such as a needle-type member, other than the planar member. Further, the same element as that of the foregoing embodiment will be denoted by the same reference numeral, and a description thereof will be omitted or simplified.

A sample holding member 241 according to the third modified embodiment has a needle shape, for example. A sample S held on a frond end of the sample holding member 241 may be used as a probe of a scanning probing microscope such as a scanning tunneling microscope or an atomic force microscope.

The support region 55 at the first recessed portion 53 of the support section 42 is provided with a groove 256 for mounting the sample holding member 241, instead of the supporting protrusion 56 of the foregoing embodiment.

A clip 243 includes a third grip portion 261, a second grip portion 62 disposed oppositely to the third grip portion 261, and two connection parts 63 connecting the third grip portion 261 and the second grip portion 62. The clip 243 is attached to the first and second recessed portions 53 and 54 of the support section 42 such that the support section 42 is fitted in between both sides of the thickness direction H by the third grip portion 261 and the second grip portion 62.

The third grip portion 261 press and fastens the sample holding member 241 against the groove 256 of the support region 55 at the first recessed portion 53 on the first surface 51 side of the support section 42 while blocking at least a portion of the each through holes 58 of two penetration regions 57.

According to the third modified embodiment, since the sample holder 12 is provided to hold the needle-type sample holding member 241, an increase in equipment costs can be prevented while securing the compatible configuration for the transfer of a probe to a scanning probing microscope.

Other modified embodiment will now be described.
While the foregoing embodiment has illustrated that the penetration region 57 of the sample stage unit 14 is provided with the through hole 58, the present invention is not limited thereto, but may have a recessed groove, instead of the through hole 58.

Although the preferred embodiments of the present invention have been disclosed for illustrative purposes, the present invention is not limited to such preferred embodiments. Those skilled in the art will appreciate that various modifications, additions and substitutions are possible, without departing from the scope and spirit of the invention. The embodiments and modifications thereof, as well as equivalents disclosed in claims, are included within the scope and spirit of the invention.

What is claimed is:

1. A sample holder removably fastened to a holder unit of a charged particle beam apparatus, the sample holder comprising:
   a sample holding member holding a sample to be irradiated with a charged particle beam;
   a support section supporting the sample holding member; and
   a clip to be mounted on a support region of the support section where the sample holding member is disposed, wherein
   the support section has a penetration region where a through hole or a recessed groove is formed in a thickness direction at a location other than the support region,
   the clip has a first grip portion and a second grip portion forming a pair between which the support section is fitted in between both sides of the thickness direction,
   the first grip portion presses the sample holding member against the support region on a first surface side of the support section as well as blocks at least a portion of the through hole or the groove, and
   the second grip portion is provided where the second grip portion does not interfere with the through hole or the groove on a second surface side of the support section.

2. The sample holder according to claim 1, wherein the support region and the penetration region are provided on a first recessed portion formed on the first surface of the support section;
   the first grip portion presses the sample holding member against the support region at the first recessed portion; and
   the second grip portion is disposed at a second recessed portion formed on the second surface of the support section.

3. The sample holder according to claim 1, wherein outer shape of both ends of the support section in an orthogonal direction to the thickness direction and a mounting direction of the clip is formed in a shape changing towards decreasing thickness towards a front end.

4. A member mounting device for mounting the sample holding member to the support section of the sample holder according to claim 1, the member mounting device comprising:
   a support section fastening portion fastening the support section with the clip mounted thereto;
   a displacement member displacing towards the thickness direction of the support section and elastically deforming the clip to broaden a gap between the first grip portion and the second grip portion by being inserted into the hole or the recessed groove towards the first surface side from the second surface side of the support section and pressing the first grip portion in the thickness direction, and
   a driver mechanism displacing the displacement member in the thickness direction.

5. A charged particle beam apparatus comprising:
   a holder unit removably fastening the sample holder according to claim 1;
   a sample chamber receiving the holder unit; and
   a charged particle beam column irradiating the sample with a charged particle beam.

6. The charged particle beam apparatus according to claim 5, wherein the holder unit includes:
   a support member supporting the sample holder, and a fastening member fastening both ends of the support section to the support member in a direction orthogonal to the thickness direction and a mounting direction of the clip.

* * * * *